(12) United States Patent
Hannebauer

(10) Patent No.: US 8,063,370 B2
(45) Date of Patent: Nov. 22, 2011

(54) SEMICONDUCTOR DEVICE AND METHOD OF MANUFACTURING THE SAME

(75) Inventor: Robert Hannebauer, Vancouver (CA)

(73) Assignees: Hanvision Co., Ltd. (KR); Lumiense Photonics Inc. (CA)

( * ) Notice: Subject to any disclaimer, the term of this patent is extended or adjusted under 35 U.S.C. 154(b) by 297 days.

(21) Appl. No.: 12/355,131

(22) Filed: Jan. 16, 2009

(65) Prior Publication Data

US 2010/0181486 A1 Jul. 22, 2010

(51) Int. Cl.
*G01J 5/20* (2006.01)

(52) U.S. Cl. ..................................... 250/338.4

(58) Field of Classification Search ............... 250/338.1, 250/338.4, 339.03

See application file for complete search history.

(56) References Cited

FOREIGN PATENT DOCUMENTS

KR 10-0704378 3/2007
KR 100704378 B1 * 3/2007

* cited by examiner

*Primary Examiner* — Mark R Gaworecki
(74) *Attorney, Agent, or Firm* — Cantor Colburn LLP

(57) ABSTRACT

A micro-bolometer type infrared (IR) sensing device is provided. The IR sensing device includes an absorbed heat discharging part and a sensing structure part formed as bean structure, spaced apart from the absorbed heat discharging part, supported at least at one end on the absorbed heat discharging part, and discharging heat absorbed in the sensing structure part by being elastically deformed and thus touching the absorbed heat discharging part. The sensing structure part includes a sensing part with variation in secondary attribute according to heat and a light-absorbing part formed into one unit with the sensing part in a manner to surround the sensing part as seen in section view, and converting energy of incident photons into heat. The sensing structure part discharges heat absorbed therein by being elastically deformed and thus touching the absorbed heat discharge part spaced apart downward from the sensing structure part.

16 Claims, 7 Drawing Sheets

SEMICONDUCTOR DEVICE AND METHOD OF MANUFACTURING THE SAME

BACKGROUND

1. Field

The following description relates to a semiconductor device, and more particularly, to a micro-bolometer type infrared (IR) sensing device.

2. Description of the Related Art

A micro-bolometer type infrared (IR) sensing device senses IR light by detecting variation in a secondary attribute that responds to the heat absorbed when the IR light is applied thereon. One of the secondary attribute that is sensed is the TCR (Temperature Coefficient of Resistance). In conventional resistive-type sensing devices which take advantage of the TCR of the material, a resistive-type sensing part is made of Vanadium Oxide (VOx), poly-silicon, amorphous-silicon, thermistor ($(MnNiCO)_3O_4$), etc. These materials have an advantage that the TCR (ratio of resistance variation to temperature variation) is high, however they have a disadvantage that performance seriously deteriorates at low frequencies due to excessive flicker noise (that is, 1/f noise) caused by their inherent characteristics.

Also, such a conventional IR sensing device sometimes includes a chopper for resetting a sensing part by periodically blocking heat in the form of the thermal image that is incident on the array. However, the chopper limits the operation of the IR sensing device, and makes the construction of the IR camera system more complicated and increases manufacturing costs.

Conventional IR sensing devices have an inherent design conflict between sensitivity and image lag. To increase the sensitivity of the device each pixel must be as thermally isolated from it's environment as much as possible. A pixel that is very isolated from its environment is by design very slow to respond to changes in the scene and thus induces image lag. This new sensor has pixels that have thermal reset, thus allowing for the decoupling of sensitivity to the thermal time constant requirements of video frame rates. The thermal resetting action of this new device eliminates image lag and allows for an additional increase in sensitivity due to the elimination of the so called "Temperature Fluctuation Noise" component in the noise equations.

The present applicant has proposed a semiconductor device in which crystalline silicon thin film formed by a SOI (Silicon On Insulator) substrate manufacturing method is used as a sensing part, and a sensing structure part having a serpentine shape discharges heat by touching a substrate spaced apart downward from the sensing structure part, which has been registered as Korean Patent No. 704,378.

The semiconductor device is an improvement on conventional technologies in view of sensitivity, simplicity of structure and manufacture and elimination of image artifacts like image lag.,

SUMMARY

The present invention improves the performance of sensing infrared (IR) light and images.

Also, the present invention provides a micro-bolometer type IR sensing device having a structure for optimizing the electrical, mechanical, thermal and sensing characteristics of a serpentine structure.

According to an aspect of the invention, there is provided a semiconductor device in which a sensing structure part formed as a beam structure discharges heat absorbed therein by being elastically deformed and thus touching a heat discharge part which is separate from the sensing structure part. In the sensing structure part, a light-absorbing part is formed into one unit with the sensing part, with the light-absorbing part balanced in equal part above and below the upper and lower surfaces of the sensing part, as seen in section view.

The sensing part may be made of a material with variation in the secondary attribute according to the heat absorption of the light-absorbing part, for example, a material with variation in TCR or in ferroelectricity according to the heat absorption of the light-absorbing part.

According to another aspect of the invention, the light-absorbing part is formed at the left and right sides of the sensing part, as well as at the upper and lower sides of the sensing part, thereby surrounding all of the sensing part.

According to another aspect of the invention, the sensing structure part has a meander structure which is meandered while advancing and returning and shows a shape '⊂' or a shape '⊃' in turns at curved portions, as seen from above, near at least one end where the sensing structure part is supported. This meander increases the apparent stiffness of the whole structure without having to increase the size of the structure, and increase in the size of the structure would increase heat flow away from the sensor, which is not desirable.

According to another aspect of the invention, the light-absorbing part is made of Silicon nitride $Si_3N_4$, and the sensing part is made of a thin film of crystalline.

According to an embodiment of the present invention, there is provided a semiconductor device manufacturing method including: applying a sensing layer on a handle wafer; patterning the sensing layer to form a cavity; forming a sensing part pattern having a beam structure in the cavity; applying a light-absorbing layer on the sensing part pattern; turning the entire structure over and removing the handle wafer; and applying an additional light-absorbing layer on the rear surface of the light-absorbing layer.

According to another aspect of the present invention, the cavity is filled with a filling layer during the process, and the filling layer is removed in the final step of the process.

According to another aspect of the present invention, another absorbed heat discharge layer is applied on the filling layer. In order to make the lower surface of the absorbed heat discharge part flat to improve efficiency in heat dissipation, the upper surface of the filling layer is polished in advance to be flat.

According to the present invention, since the light-absorption part is formed on the upper and lower surfaces of the sensing part, or all around the sensing part, absorption of infrared energy can be improved, the creation of undesired curvature in the sensing structure part can be avoided, and accordingly the durability of the resultant sensor can be improved, compared to the case of having a single sided light-absorbing part.

Also, in the sensing structure part, since the sensing part is made of a thin film of crystalline silicon, and the light-absorbing part surrounding the sensing part is made of silicon nitride $Si_3N_4$, there is no interdependency between the mechanical and thermal characteristics of the sensing structure part so that the mechanical and thermal characteristics can be controlled independently, resulting in the improvement of both sensitivity and operation speed.

Furthermore, since the present invention resets absorbed heat using an elastic deformation structure based on MEMS technologies; high thermal reset speed is achieved, which provides advantages for video applications by the elimination of image-lag.

Also, since a reset structure for discharging absorbed heat is provided on a substrate below the sensing structure part, the light-absorbing area needs not to be sacrificed. Also, since such elastic deformation is driven by electrostatic deformation when a potential difference is applied, driving circuits for the electrostatic deformation can be formed by a CMOS process, and accordingly the entire semiconductor device can be manufactured only by CMOS processes. Furthermore, the light-absorbing area needs not to be sacrificed since CMOS circuits are formed below the sensor structure.

Also, in the semiconductor device manufacturing method according to the present invention, by forming a cavity in the sensing layer, and processing the sensing layer to form a sensing part, the thickness of the sensing part is thin so that mechanical stiffness is low, thereby facilitating mechanical deformation and improving response characteristics upon discharging absorbed heat. A thin cross section also is advantageous to prevent parasitic heat leakage from the sensor through the support beams and thus increases sensitivity.

Also, according to the semiconductor device manufacturing method, since a filling layer fixes the sensing part pattern in the cavity during processing, no mechanical stress remains in the resultant sensor pattern. Accordingly, the sensor characteristics are ensured and response characteristics are further improved.

Additional aspects of the invention will be set forth in the description which follows, and in part will be apparent from the description, or may be learned by practice of the invention.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the aspects of the invention.

DETAILED DESCRIPTION OF EMBODIMENTS

Figure 1:
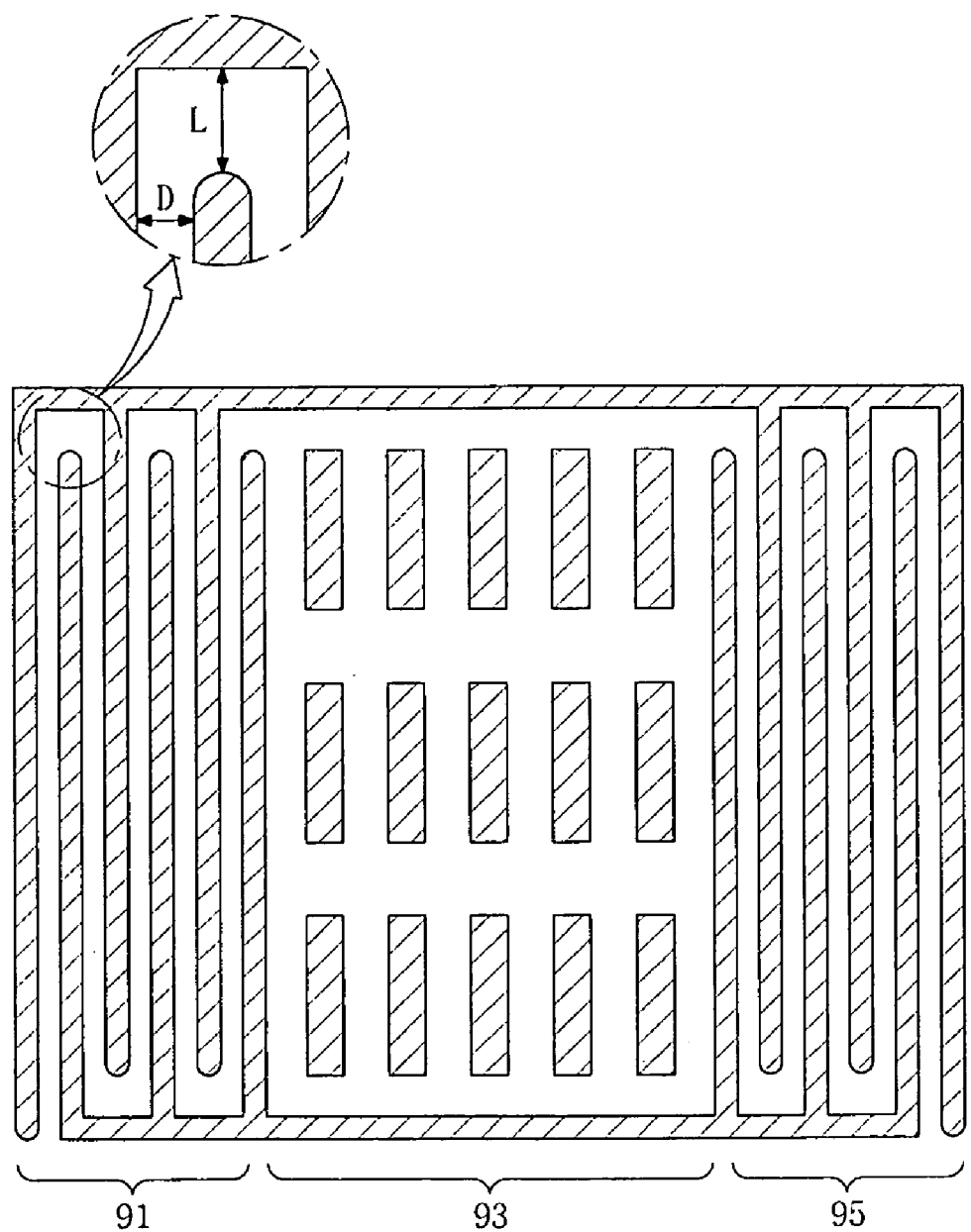
FIG. 1 is a plan view of the pixel in the semiconductor device according to an embodiment.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
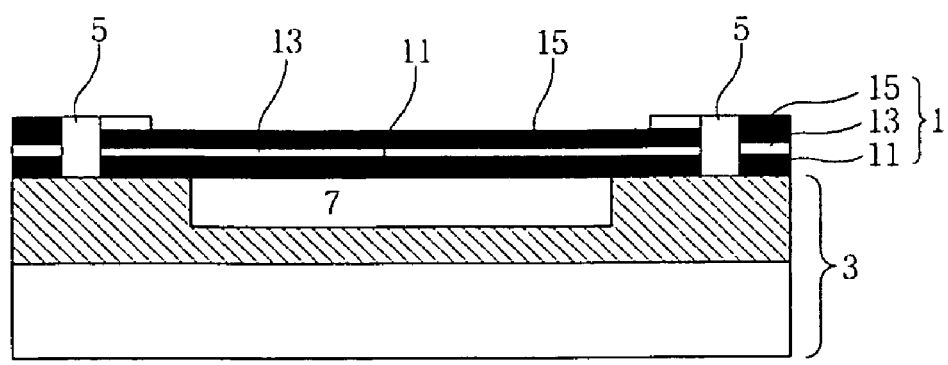
FIG. 2 is a cross-sectional view of the semiconductor device illustrated in FIG. 1.

FIG. 1 is a plan view of a semiconductor device according to an embodiment, and FIG. 2 is a cross-sectional view of the semiconductor device. Referring to FIGS. 1 and 2, the semiconductor device includes an absorbed heat discharging part 3, and a sensing structure part 1 formed as a beam structure spaced apart from the absorbed heat discharging part 3 and supported at both ends on the absorbed heat discharging part 3.

As illustrated in FIGS. 1 and 2, the sensing structure part 1 is supported at both ends on the absorbed heat discharging part 3, but may be supported at its at least one end on the absorbed heat discharging part 3. For example, the sensing structure part 11 could have a spiral shape supported at one end on the absorbed heat discharging part 3. In this case, sensing parts extend in pairs along the spiral shape, and meet at the end of the spiral shape to thus form a circuit.

The sensing structure part 1 includes a sensing part 13 with variation in electrical resistance according to heat, and light-absorbing parts 11 and 15 formed as one unit with the sensing part 13 and converting the energy of incident photons into heat. However, the sensing part 13 may be made of an arbitrary material with variation in the secondary attribute, such as its physical, chemical properties, according to heat, the variation in the secondary attribute capable of being measured.

The light-absorbing parts 11 and 15 surround the sensing part 13 and together form the beam structure. However, the present invention is not limited to this structure, and the light-absorbing parts 11 and 15 may be formed only above and below the sensing part 13 According to the current embodiment, although the light-absorbing parts 11 and 15 and the sensing part 13, are made of materials of different thermal expansion coefficients but are formed as one unit, stress due to thermal expansion is cancelled, thus avoiding the creation of undesired curvature, since the light-absorbing parts 11 and 15 are symmetrical to the sensing part 13. The manufacturing processes of the semiconductor device have to be balanced in order to avoid the accumulation of deformation due to the stress of the light-absorbing parts 11 and 15, which will be described later.

Also, an additional thickness obtained by forming two layers of the light-absorbing parts 11 and 15, instead of forming the light-absorbing parts 11 and 15 as a single layer, improves absorption of infrared (IR) energy. Increasing the thickness by forming two layers is more effective than doubling the thickness of a single layer. The reason is because the thermal time constant in a vertical direction is reduced and thus heat transfer in the vertical direction is increased.

Since a fully-passivated structure where the light-absorbing parts 11 and 15 fully surround the sensing part 13 is provided, the life cycle of the sensing part 13 is increased, and the light-absorbing parts 11 and 15 can be tuned to absorb photons of particular wavelengths by the substitution of material in parts 11 and 15 or more preferably by coating parts 11 and 15 with and additional absorbing layer. For example, an application for detection of X-ray is expected.

Figure 3:
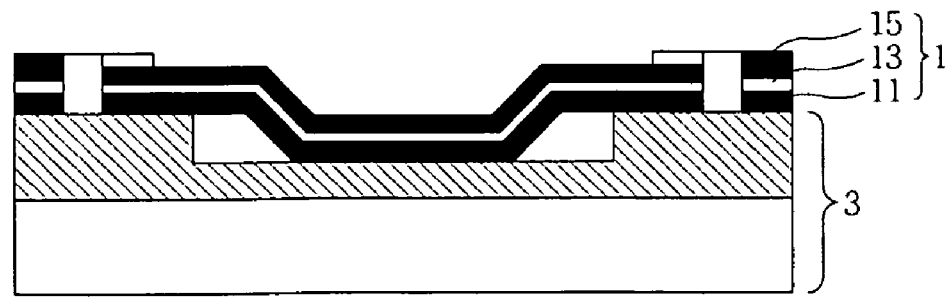
FIG. 3 shows a status where a sensing structure part is elastically deformed to discharge heat there from, in the semiconductor device illustrated in FIG. 2.

The sensing structure part 1, as illustrated in FIG. 3, is elastically deformed and touches the absorbed heat discharging part 3, thus discharging heat absorbed in the light-absorbing parts 11 and 15. According to an aspect of the present invention, the supported one end of the sensing structure part 1 has a meander structure which is meandered while advancing and returning and shows a '⊂' shape or a '⊃' shape in turns at curved portions, as seen from above. The meander structure contributes to greatly increase stiffness by constraining the angular components of deformation.

According to the current embodiment, the sensing structure part 1 is based on a serpentine structure (that is, 91 and 95 in FIG. 1) which is narrow in width and curved in form. The center portion 93 of the sensing structure part 1 is formed as a grid pattern. The grid pattern is also effective in increasing resistance because of having a narrow width to reduce the cross-section of the sensing part 13.

In the current embodiment, the sensing part 13 is made of Silicon On Insulator (SOI), and the light-absorbing parts 11 and 15 surrounding the sensing part 13 are made of silicon nitride $Si_3N_4$. Due to the structure where the light-absorbing parts 11 and 15 made of silicon nitride $Si_3N_4$ surround the sensing part 13, the mechanical and thermal characteristics of the sensing part 13 can be optimized. That is, it is preferable that the beam structure has high stiffness and low thermal conductivity. However, conventionally, it was contradictory that the thickness of the beam has to be increased to enhance stiffness, while the thickness of the beam has to be decreased to reduce thermal conductivity.

The stiffness of the sensing structure part 1 depends on the light-absorbing parts 11 and 15 made of silicon nitride $Si_3N_4$, and its thermal characteristics depend on the sensing part 13 made of crystalline silicon. Meanwhile, the electrical characteristics of the sensing structure part 1 can be controlled by adjusting an implant applied to the sensing part 13 in the areas of 91,93 and 95, each implant can be independent from the others if necessary to tune the electrical characteristics. Accordingly, by achieving desired stiffness through the structure where the light-absorbing parts 11 and 15 surround the sensing part 13, improving thermal characteristics through the thinness of the sensing part 13, and optimizing electrical characteristics through adjustment of the implant applied to the sensing part 13, an optimized sensor can be manufactured.

In the current embodiment, in order to effectively discharge heat absorbed in the light-absorbing parts 11 and 15, a sufficient flatness of the upper surface of the absorbed heat discharging part 3 which the sensing structure part 1 contacts upon deformation has to be ensured. By making the upper surface of the absorbed heat discharging part 1 to be sufficiently flat, an amount of heat dissipation through the contact upon deformation is much greater than an amount of heat dissipation through the structure where the sensing structure part 1 is supported on the absorbed heat discharging part 3.

In the current embodiment, the absorbed heat discharging part 3 is a handle wafer, but may have a multi-layer structure or an arbitrary structure having a wide surface area and high thermal conductivity.

Electrodes 5 are provided to supply or receive electrical signals to or from the sensing part 13. Also, a heat discharge driving part, which is not shown in the drawings, is provided to apply a potential difference between the sensing part 13 and absorbed heat discharging part 3, thus elastically deforming the sensing structure part 1 and resetting heat absorbed in the absorbed heat discharging part 3. That is, the sensing structure part 1 contacts the absorbed heat discharge part 3 through deformation by electrostatic actuation, thus discharging heat vertically. Of note in this system is the disparity between thermal leakage current between the two states of operation. In the non-reset state the heat has to flow the long and winding serpentine structure and thus effectively isolates the sensing part 93 from any heat leakage that can interfere with high sensitivity. However, once the sensor is actuated against the heat discharging part 3, the heat flows vertically out of the structure. In this configuration it is easy to obtain at least 5 orders of magnitude difference in thermal conduction between the two states.

The resistance of the sensing part 13 can be detected by using a current flowing through the sensing part 13. A signal proportional to the current is stored in the pixel, and read and output through a read circuit similar to that of a CMOS image sensor.

The driving circuits and sensing circuits described above are CMOS circuits, and are integrated together with the sensing structures in the semiconductor device. The CMOS circuits can be integrated on the sides of the sensing structure part 1, or on the rear portion of the handle wafer (that is, the absorbed heat discharge part 3). If the CMOS circuits are integrated on the rear portion of the handle wafer, the light-absorbing parts 11 and 15 need not to be sacrificed and the area used for receiving light can be optimized.

FIGS. 4A through 4J are a view for explaining a semiconductor device manufacturing method according to an embodiment. According to the current embodiment, the semiconductor device manufacturing method includes: applying a sensing layer with variable resistance according to heat, on a handle wafer; forming a cavity by patterning the sensing layer; forming a sensing part pattern having a beam structure in the cavity; applying a light-absorbing layer for converting energy of incident photons into heat, along the sensing part pattern; turning the entire structure over and removing the handle wafer, thus exposing the rear surface of the sensing part pattern; and forming an additional light-absorbing layer on the rear surface of the light-absorbing layer applied on the sensing part pattern, thereby forming a sensing structure part having a beam structure.

Figure 4A:
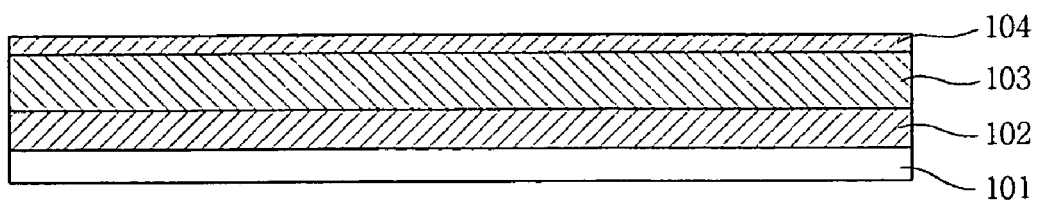
FIGS. 4A through 4J are a view for explaining a semiconductor device manufacturing method according to an embodiment.

Referring to FIG. 4A, first, an oxide layer 102 is applied on a handle wafer 101, a Si sensing layer 103 which is a silicon thin film is formed on the oxide layer 102, and then another oxide layer 104 is applied on the Si sensing layer 103.

In the current embodiment, the sensing layer 103 with variable resistance according to heat is a SOI wafer which is manufactured using an SOI substrate manufacturing process. Any suitable process for SOI can be used.

Crystalline silicon has Temperature Coefficient of Resistance (TCR) of 0.2%/° K. The TCR value is smaller than the TCR values (2-3%/° K.) of Vanadium Oxide (VOx), polysilicon, armorphous-silicon, thermistor (($MnNiCO)_3O_4$), etc. However, in the case of crystalline silicon, noise generation is much less than in polysilicon, armorphous-silicon, etc. In crystalline silicon, Johnson noise (or thermal noise) expressed by Equation 1 is the main noise contribution, but in polysilcon, armorphous-silicon, etc., flicker noise (or 1/f noise) is the main noise contribution.

$$V_n = \sqrt{4KTBR}, \quad (1)$$

where $V_n$ represents Johnson noise, K represents the Boltzmann constant, B represents a frequency band, and R represents resistance.

Also, since the sensing layer 103 is made of crystalline silicon, its electrical resistance increases and accordingly Signal Noise Ratio (SNR) is increased, so that sensor performance can be greatly improved. The reason of increasing resistance is first to reduce current flowing through the sensing part 13. This is aimed to reduce the self-heating from the bias current. Second, the reason is to improve SNR as seen in Equation 2.

$$SNR = \frac{(i \cdot (TCR) \cdot \Delta T \cdot \sqrt{R})}{\sqrt{4KTB}}, \quad (2)$$

where SNR represents signal noise ratio, i represents current, TCR represents temperature coefficient of resistance, ΔT represents a change in temperature, R represents resistance of sensor, K represents the Boltzmann constant, T represents the temperature, and B represents a frequency band.

Figure 4B:
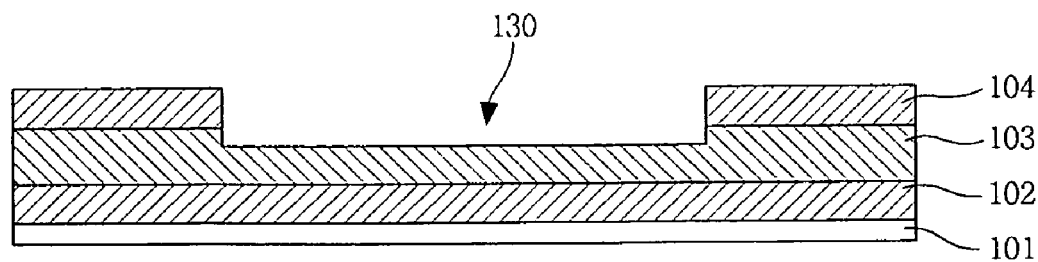

Thereafter, as illustrated in FIG. 4B, a part of the silicon oxide film 104 and the sensing layer 103 made of crystalline silicon is etched by reactive ion etching (RIE), so that a cavity 130 is formed. The cavity 130 provides a space that is to be filled with polysilicon, and also reduces the thickness of the crystalline silicon layer which is the sensing part of the sensor region. In the transistor process, a thick silicon layer is needed, but the sensing part 103 is formed thin because of having to be flexibly bent mechanically. This structure facilitates mechanical deformation when heat is discharged from the final sensing structure part, thereby improving the responsiveness of the sensor.

Thereafter, by performing ion implantation and annealing on the sensing layer 103 exposed by etching, electrical resistance is adjusted. Accordingly, the electrical characteristics of the sensor are adjusted.

Figure 4C:
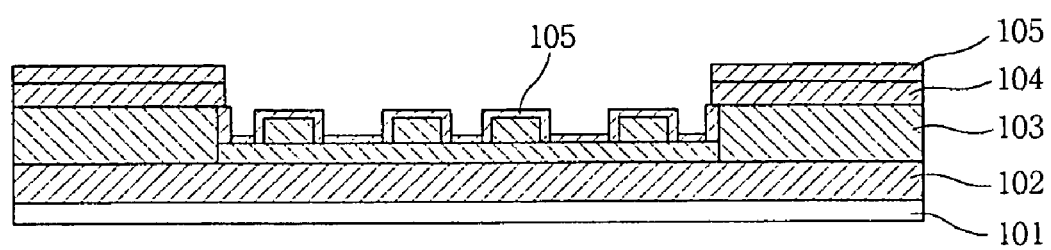

Then, as illustrated in FIG. 4C, the sensor part 103 and sacrificial oxide film 104 are subjected to RIE processing, so that a sensing part pattern is formed as a beam structure. In the specification, the term "beam structure" means a structure formed by weaving or linking beams to reduce the section area of the sensing part 13. The beam structure may be a grid pattern of beams, a serpentine structure, a S-shaped structure, a spring-shaped structure, etc. For the improvement of mechanical characteristics, the supported one end of the sensing structure part 1 can may be a meander structure which is meandered while advancing and returning and shows a '⊂' shape and a '⊃' shape in turns at the curved portions, when seen from above. The meander structure improves mechanical stiffness by minimizing angular deflection in the curved portions. Also, by making the widths of the beams at the curved portions wider than in the remaining parts, the mechanical characteristics can be further improved.

Thereafter, a $SiO_2$ pad oxide layer 105 is grown. The $SiO_2$ pad oxide layer 105 acts to electrically isolate the sensing part 13 from the light-absorbing parts 11 and 15 in the sensing structure part 1 (see FIG. 2).

Figure 4D:
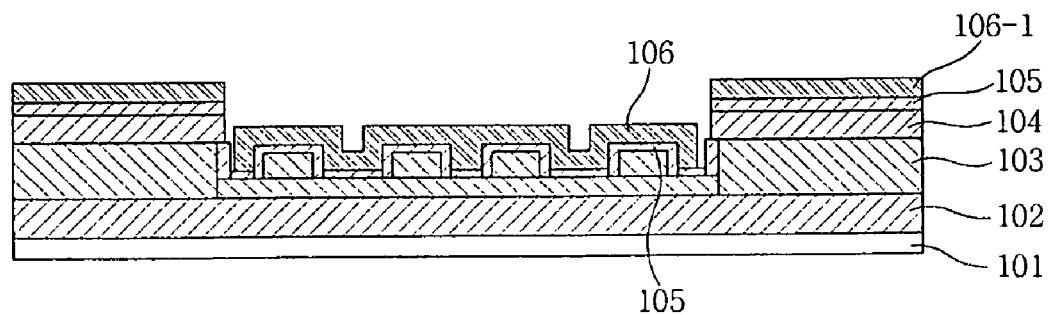

Then, referring to FIG. 4D, light-absorbing parts 106 and 106-1 made of silicon nitride are deposited on the pad oxide layer 105. Here, the light-absorbing part 106 is self-aligned by the cavity. The reference number 106 represents a light-absorbing part in the sensor region, the reference number 106-1 represents a light-absorbing part formed outside the sensor region. The light-absorbing layer 106 or 106-1 for converting energy of incident photons into heat may be a single layer or a multi-layer structure made of any one of materials, such as $SiO_2$ and $Si_3N_4$, suitable for the CMOS process.

Figure 4E:
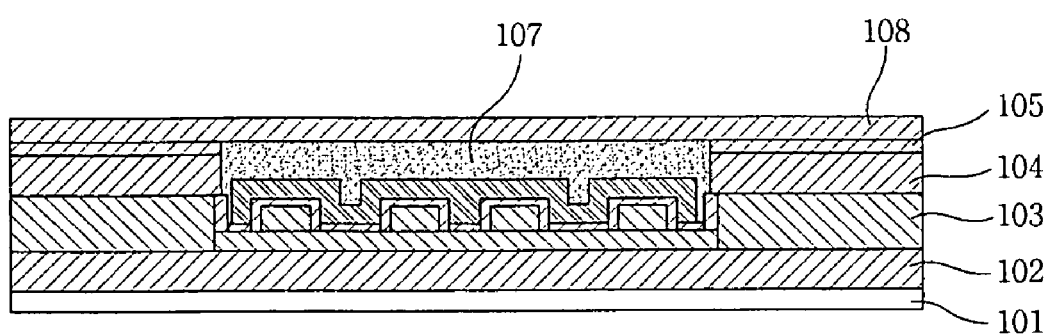

Then, as illustrated in FIG. 4E, the cavity is all filled with polysilicon 107. Then, the surface of the wafer is polished to be flat by chemical-mechanical polishing (CMP) until the silicon nitride outside the sensor region is exposed. Here, the silicon nitride acts as a CMP etch stop. Thus, the polysilicon 107 is at the nearly same height as the silicon nitride, and the upper surface of the polysilicon 107 is processed to a flat surface having a thickness of about 200 nm. It is important that the lower surface of an oxide layer 108, that is, the interfacial surface between the polysilicon 107 and oxide layer 108 is flat. This is because the flat interfacial surface widens the contact areas between the sensing structure part 1 and the absorbed heat discharging part 3, thus increasing the amount of heat dissipation (see FIGS. 2 and 3).

Then, the silicon nitride 106-1 is stripped off, and an oxide layer 108 that is to be part of the absorbed heat discharge layer 3 is applied thereon, the surface of the oxide layer 108 is polished to provide a bonding surface.

Figure 4F:
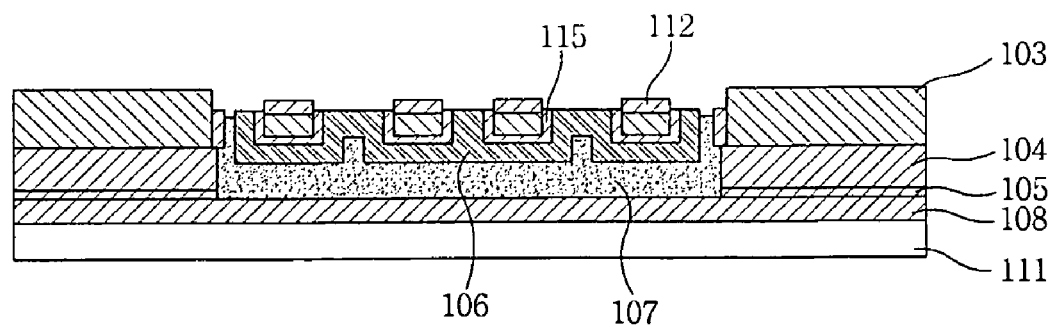

Next, another handle wafer 111 (see FIG. 4F) is bonded to the bonding surface. Thereafter, the original SOI wafer handle, that is, the handle wafer 101 is removed by back-grinding and thus the rear portion of the sensing structure part 1 is exposed. Then, as illustrated in FIG. 4F, the entire structure is turned over, so that a new SOI wafer in which the sensing structure part 1 is buried is provided.

Successively, the wafer is patterned by lithography until the patterns of the sensor region are all exposed. During the lithography, the sensor patterns are firmly supported by the polysilicon 107 filled in the cavity 130, and another cavity is formed. The cavity also acts to reduce the thickness of the sensor and provides a space in which polysilicon will be filled. Then, a sacrificial oxide layer is deposited on the upper surface of the sensor region, and the oxide layer of the remaining portion except for the sensor region is removed by RIE using a mask. Accordingly, a pad oxide layer 112 for isolation between the light-absorbing part 113 and the sensing part is additionally grown.

Figure 4G:
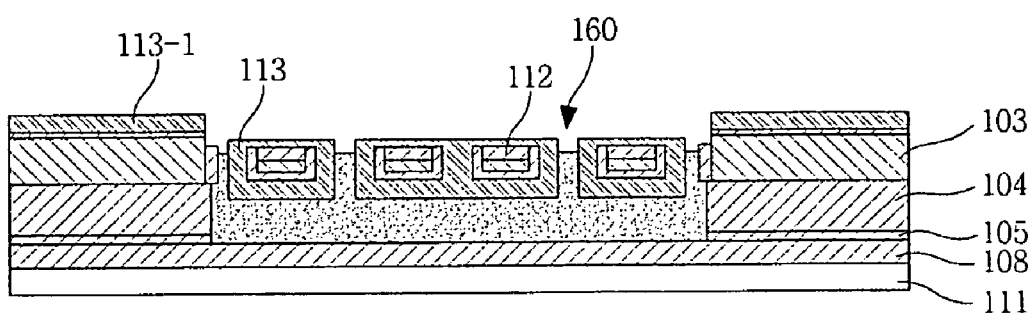

Referring to FIG. 4G, a silicon nitride forming a light-absorbing part 113 is additionally applied on the oxide layer. Accordingly, crystalline silicon acting as a sensing part is all surrounded by the light-absorbing part 113. Then, the oxide layer remaining on the original polysilicon is removed and new polysilicon 107-1 is attached to the previously filled polysilicon 107.

Figure 4H:
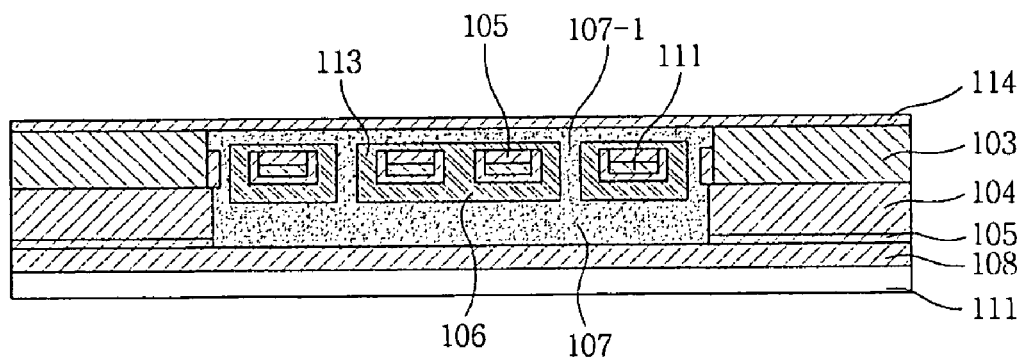
Figure 4I:
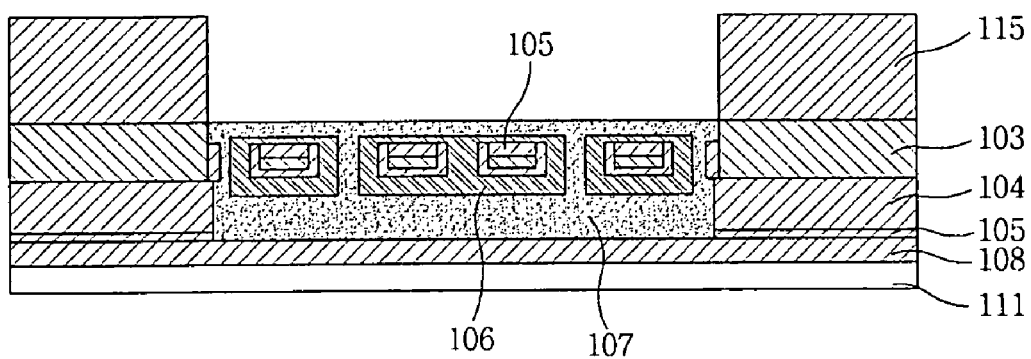

Referring to FIG. 4H, the polysilicon 107-1 is filled in the cavity near the sensing structure part 1 and thus merged with the previously filled polysilicon 107. Then, CMP is performed so that the polysilicon 107 and 107-1 is disposed at the same height as the light-absorbing part made of silicon nitride. Then, the silicon nitride is stripped off, and CMP and surface polishing are additionally performed to achieve a flatness satisfying the requirements of the standard CMP process.

Figure 4J:
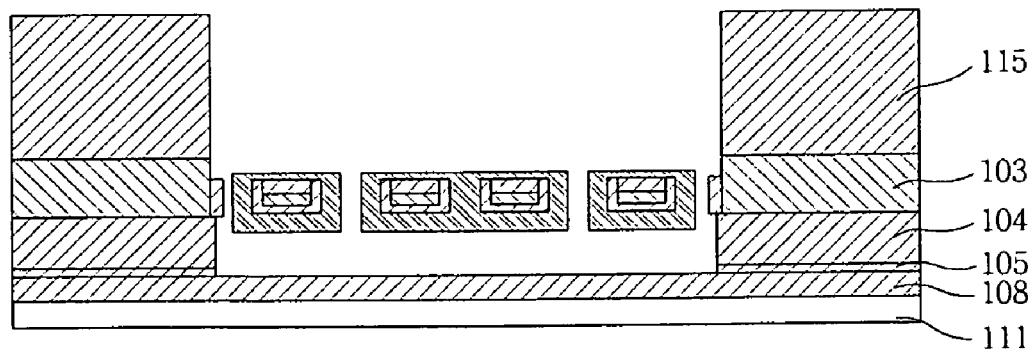

Then, a sacrificial oxide film 114 is grown. Thereafter, a silicon layer 115 is deposited thereon, and the standard CMOS process is performed in the structure illustrated in FIG. 4I, so that driving circuits are formed. Here, the CMOS processes for forming the driving circuits are performed on the remaining regions except for the sensor region of the wafer. If the circuit-forming processes are terminated after a metal process, the sensor region is exposed using a pad mask. RIE is stopped at the polysilicon. Then, in order to remove all polysilicon 107 and 107-1 around the sensor region, anisotropic wet etching is performed using Tetramethylammonium hydroxide (TMAH). The TMAH etching is 100:1 selective to silicon over silicon nitride and oxide. Accordingly, as illustrated in FIG. 4J, the whole sensor structure part is exposed in a manner to float over the cavity, so that a MEMS device which operates as a sensor and is thermally reset is manufactured.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A semiconductor device comprising:
an absorbed heat discharging part;
a sensing structure part formed as beam structure, spaced apart from the absorbed heat discharging part, supported at least at one end on the absorbed heat discharging part, and discharging heat absorbed in the sensing structure part by being elastically deformed and thus touching the absorbed heat discharging part,
the sensing structure part comprising:
a sensing part with variable resistance according to heat, and
a light-absorbing part formed into one unit with the sensing part at least at both upper and lower portions of the sensing part, and converting energy of incident photons into heat.

2. The semiconductor device of claim 1, wherein the light-absorbing part is formed at left and right portions of the sensing part as well as the upper and lower portions of the sensing part, thereby surrounding the sensing part.

3. The semiconductor device of claim 1, wherein the sensing structure part has a meander structure which is meandered while advancing and returning and shows a shape '⊂' or a shape '⊃' in turns at curved portions, as seen from above, near at least one end where the sensing structure part is supported.

4. The semiconductor device of claim 3, wherein the light-absorbing part is made of silicon nitride $Si_3N_4$, and the sensing part is formed of a crystalline silicon thin film.

5. The semiconductor device of claim 3, wherein the sensing structure part has a serpentine structure where a beam having a narrow width is meandered.

6. The semiconductor device of claim 5, wherein in the sensing structure part, a curved portion of the beam has a width wider than that of a straight portion of the beam.

7. The semiconductor device of claim 1, further comprising a heat discharge driving part for resetting heat absorbed in the sensing structure part by applying a potential difference to the sensing part and the absorbed heat discharging part and thus elastically deforming the sensing structure part.

8. The semiconductor device of claim 1, wherein the light absorption unit is tuned to convert infrared (IR) energy into heat.

9. The semiconductor device of claim 1, wherein the light absorption unit is tuned to convert X-ray energy into heat.

10. A semiconductor device comprising:
an absorbed heat discharge part;
a sensing structure part forming a beam structure spaced apart from the absorbed heat discharging part and supported at at least one end on the absorbed heat discharging part, and discharging heat absorbed therein by being elastically deformed and thus touching the absorbed heat discharge part, and
the sensing structure part comprising a sensing part with variation in a secondary attribute according to heat, and a light-absorbing part formed as one unit with the sensing part, at upper and lower sides of the sensing part, as seen in section view, and converting energy of incident photons into heat.

11. The semiconductor device of claim 10, wherein the light-absorbing part is formed at left and right sides of the sensing part, as well as at the upper and lower sides of the sensing part, as seen in section view, thereby surrounding all of the sensing part.

12. The semiconductor device of claim 10, wherein a supported one end of the sensing structure part has a meander structure which is meandered while advancing and returning and shows a '⊂' shape or a '⊃' shape in turns at curved portions, as seen from above.

13. The semiconductor device of claim 12, wherein the sensing structure part is based on a serpentine structure which is narrow in width and curved in form.

14. The semiconductor device of claim 13, wherein in the sensing structure part, a curved portion of the beam has a width wider than that of a straight portion of the beam.

15. The semiconductor device of claim 10, wherein the light absorption unit is tuned to convert infrared (IR) energy into heat.

16. The semiconductor device of claim 10, wherein the light absorption unit is tuned to convert X-ray energy into heat.

* * * * *